(12) United States Patent
Krishnamurthy et al.

(10) Patent No.: US 7,573,329 B2
(45) Date of Patent: Aug. 11, 2009

(54) SYSTEM AND METHOD FOR IM3 REDUCTION AND CANCELLATION IN AMPLIFIERS

(75) Inventors: Vikram Bidare Krishnamurthy, Smyrna, GA (US); Tanveer Kaur Khanijoun, Atlanta, GA (US); Kyle Mark Hershberger, Atlanta, GA (US); Jeremy Thomas Reed, Atlanta, GA (US); Paul Erik Pace, Acworth, GA (US)

(73) Assignee: VT Silicon, Inc., Atlanta, GA (US)

( * ) Notice: Subject to any disclaimer, the term of this patent is extended or adjusted under 35 U.S.C. 154(b) by 161 days.

(21) Appl. No.: 11/673,422

(22) Filed: Feb. 9, 2007

(65) Prior Publication Data

US 2007/0222512 A1    Sep. 27, 2007

Related U.S. Application Data

(60) Provisional application No. 60/771,924, filed on Feb. 9, 2006, provisional application No. 60/850,146, filed on Oct. 6, 2006.

(51) Int. Cl.
*H03F 1/26* (2006.01)
(52) U.S. Cl. ...................................... 330/149
(58) Field of Classification Search ............. 330/124 R, 330/136, 149, 295
See application file for complete search history.

(56) References Cited

U.S. PATENT DOCUMENTS 4,531,098 A     7/1985  Reed
6,831,511 B2 * 12/2004  Hollingsworth et al. . 330/124 R
6,856,796 B2    2/2005  Ding et al.
2003/0179041 A1 * 9/2003  Weldon ....................... 330/149
2005/0237112 A1 * 10/2005  Petrovic et al. ............. 330/149
2006/0119433 A1 * 6/2006  Proehl ......................... 330/295

OTHER PUBLICATIONS

Yongwang Ding and Ramesh Harjani, A High-Efficiency CMOS +22-dBm Linear Power Amplifier, IEEE Journal of Solid-State Circuits, Sep. 2005, pp. 1895-1900, vol. 40, No. 9.

(Continued)

*Primary Examiner*—Robert Pascal
*Assistant Examiner*—Khiem D Nguyen
(74) *Attorney, Agent, or Firm*—Nelson Mullins Riley & Scarborough, L.L.P.

(57) ABSTRACT

Sets of power amplifier branches (which comprise an RF/microwave amplifier stage) are power combined within each stage and each set of power amplifier branches are biased in different classes of operation by bias circuits possessing different impedance characteristics such that the fundamental frequency components present at the output are in-phase with one another and the IMD3 components are anti-phase over a broad range of power levels. The RF input signal is provided by the output of the previous stage of the RF/microwave amplifier. The output of each stage is formed by power combining sets of these power amplifier branches, each of which are separately biased, so the fundamental components are additive resulting in the maximum possible output power and the IM3 components cancel partially or completely. IM3 reduction or cancellation can be achieved over a large range of output powers with the use of a feed forward control loop monitoring the input power and appropriately adjusting the bias currents and impedance characteristics of the bias circuits feeding the individual power amplifier branches in each stage of the RF/microwave amplifier.

21 Claims, 8 Drawing Sheets

OTHER PUBLICATIONS

Charles F. Campbell, A Fully Integrated Ku-Band Doherty Amplifier MMIC, IEEE Microwave and Guided Wave Letters, Mar. 1999, pp. 114-116, vol. 9, No. 3.

D R Webster, D G Haigh, and A E Parker, Novel Circuit Synthesis Technique Using Short Channel GaAs Fets Giving Reduced Intermodulation Distortion, IEEE Journal, 1995, pp. 1348-1351.

Danny Webster, Jonathan Scott and David Haigh, Control of Circuit Distortion by the Derivative Method, IEEE Microwave and Guided Wave Letters, Mar. 1996, pp. 123-125, vol. 6, No. 3.

D.R. Webster, D.G. Haigh, J.B. Scott and A.E. Parker, Derivative Superposition—A Linearisation Technique for Ultra Broadband Systems, The Institution of Electrical Engineers, 1996, pp. 3/1-3/14, Published by the IEE, Savoy Place, London WC2R 0BL, UK.

D.R. Webster, G.R. Ataei, A. Assenov, D.G. Haigh and I. Thayne, Reduction of 3rd Order Intermodulation Distortion Through the Use of a High Pass Transmission Line Implementation of "Derivative Superposition", and Through the Use of Channel Doped HEMTS, The Institution of Electrical Engineers, 1996, pp. 3/1-3/10, Published by the IEE, Savoy Place, London WC2R 0BL, UK.

K.W. Kobayashi, A.K. Oki, A. Gutierrez-Aitken, P. Chin, Li Yang, E. Kaneshiro, P.C. Grossman, K. Sato, T.R. Block, H.C. Yen, and D.C. Streit, An 18-21 GHz InP DHBT Linear Microwave Doherty Amplifier, IEEE Radio Frequency Integrated Circuits Symposium, 2000, pp. 179-182.

Shawn P. Stapleton, Adaptive Feedforward Linearization for RF Power Amplifiers, 2001, pp. 1-28.

Steve Cripps, RF Power Amplifiers for Wireless Communications, pp. 225-239.

PCT International Search Report, dated Jun. 5, 2008.

Written Opinion of the International Searching Authority, dated Jun. 5, 2008.

* cited by examiner

SYSTEM AND METHOD FOR IM3 REDUCTION AND CANCELLATION IN AMPLIFIERS

CLAIM OF PRIORITY

This application claims priority to U.S. Provisional Application No. 60/771,924, filed on Feb. 9, 2006 and U.S. Provisional Application No. 60/850,146, filed on Oct. 6, 2006, the entire disclosures of which are incorporated by reference herein.

FIELD OF THE INVENTION

This invention generally relates to radio frequency/microwave amplifiers for communication devices, and in particular, to a system and method for automatically reducing third order intermodulation product levels to reduce signal distortion and maintain high data rates for communication systems over a wide range of frequencies.

BACKGROUND OF THE INVENTION

Amplifiers are used in all cell phones to amplify a modulated signal from a transceiver prior to passing the signal through the front end of the cell phone, which typically consists of passive components and a switch into an antenna where the signal is transmitted to a base station. FIG. 1 illustrates a high level topography of the circuits contained in a prior art cell phone. Generally, a baseband integrated chip 1 provides a signal to a transceiver 2. The transceiver transmits an RF signal to a power amplifier 3, which outputs an RF signal to a front end module 4 and out into the atmosphere by an antenna 5. All of these components are housed within a typical cell phone 6.

Two important factors driving the design of RF/microwave power amplifier 3 are linearity and efficiency. As used herein, linearity refers to the device's ability to amplify without distortion, and efficiency refers to the device's ability to convert DC power to RF/microwave power with as little wasted energy as possible. In conventional power amplifier designs, improvement in one area typically causes degradation in the other. An RF/microwave amplifier has two regions of operation: linear and nonlinear. In the linear region, the input signal envelope is amplified and no distortion is present at the output. For large peak to peak input signal levels, the amplifier enters the non-linear region and the output signal becomes distorted.

Distortion in RF/microwave amplifiers is generally caused by amplitude clipping, phase variations as a function of signal amplitude, and intermodulation products. Amplitude clipping occurs when the peak to peak input signal envelope amplitude extends beyond the linear region of the amplifier. Phase variations with signal amplitude also result when the peak to peak input signal envelope amplitude extends beyond the linear region of the amplifier. Intermodulation distortion (IMD) occurs as a result of nonlinearities in the amplifier transfer function resulting in mixing products being generated at the sum and difference frequencies of the input signals.

The third order intermodulation product (IMD3) is of great interest since this product is very close to the carrier signal on the frequency spectrum. Being located so close to the carrier signal, IMD3 is very difficult to eliminate or even reduce and is often the limiting factor in the linearity of the RF/microwave amplifier. The output third-order intercept point (OIP3), also known as OTOI (Output Third Order Intercept), is defined as the intersection point between the extrapolated 1:1 slope of the fundamental output power and the extrapolated 3:1 slope of the third-order intermodulation products. If the extrapolations are done well within the linear region, the OIP3 (OTOI) becomes a useful specification for predicting the linearity of the power amplifier. Thus, the higher the OIP3 (OTOI) point, the more linear the power amplifier. As mentioned above, reducing the IMD of the power amplifier improves its linearity and thus improves the OIP3 (OTOI).

Referring to FIG. 2, power amplifier 3 comprises one or more stages 7a, 7b . . . 7n connected in series by matching networks 8a, 8b, 8c . . . 8n that consist of a circuit topology of zero or more resistors, capacitors, and inductors. Each stage 7a, 7b . . . 7n consists of a number of branches 18a, 18b . . . 18n connected in parallel. Each branch 18 has of one or more unit cells 20 connected in parallel. A unit cell is composed of one or more transistors in a circuit topology of zero or more resistors, capacitors, and inductors.

Each power amplifier stage 7 is typically biased with a bias circuit (not shown) that provides the appropriate current or voltage for the branches to operate in a single class of operation. As used herein, a class of operation is determined by the percentage of an input sinusoidal signal during which the unit cells in each branch is on and conducting current. For example, in Class A operation, the branches are all biased such that they are on and conducting current for 360 degrees of the input sinusoid signal. In Class B, the branches are on and conducting for 180 degrees of the input signal. The near-Class B biasing condition is for the case where the branches are on and the conduction angle is close to but above 180 degrees. In Class AB, the branches are on and conducting typically at or around 270 degrees but may vary between 180 degrees and 360 degrees. The limits for each class of operation are not rigorously set and are used herein for purposes of general understanding of the operating condition of an amplifier.

Several methods have been tried to improve the response of power amplifiers. One method is to operate the RF/microwave amplifier at lower power levels to ensure that the device remains in the linear region. A drawback to this method is that when the device is operated at a lower power level it is operating less efficiently than it does at higher power levels.

The present invention seeks to improve the output response of RF/microwave power amplifiers by reducing IM3 levels and improving the OIP3 (OTOI) of the power amplifier. One solution to this problem is to reduce the distortion present in the linear and nonlinear region so that the operation of the amplifier can be extended into the nonlinear region where higher power levels are possible.

SUMMARY OF THE INVENTION

The present invention recognizes and addresses the foregoing considerations, and others, of prior art constructions and methods.

These and/or other objects are achieved in one preferred embodiment of a discrete amplifier for canceling at least one distortion component at the output of the discrete amplifier comprising a first stage having at least a first branch and a second branch in parallel with one another, wherein each of the first and second branches is formed of one or more transistor legs having one or more unit cells in parallel with one another and a second stage having at least a third branch and a fourth branch in parallel with one another, wherein each of the third and fourth branches is formed of one or more transistor legs having one or more unit cells in parallel with one another. The discrete amplifier further comprises a first biasing circuit having a first impedance and a first biasing level, the first biasing circuit being operatively connected to the first stage first branch for biasing the first branch into a first mode of operation, a second biasing circuit having a second impedance and a second biasing level, the second biasing circuit being operatively connected to the first stage second branch for biasing the second branch into a second mode of operation, a third biasing circuit having a third impedance and a third biasing level, the third biasing circuit being operatively connected to the second stage third branch for biasing the third branch into a third mode of operation, and a fourth biasing circuit having a fourth impedance and a fourth biasing level, the fourth biasing circuit being operatively connected to the second stage fourth branch for biasing the fourth branch into a fourth mode of operation. At least one of the first mode of operation and the second mode of operation, and the third mode of operation and the fourth mode of operation are chosen so that at least one distortion component is substantially canceled at a respective output of at least one of the first stage and the second stage.

In another embodiment, the first biasing circuit first impedance and first biasing level differs from the second biasing circuit second impedance and second biasing level. In other embodiments, the impedance of the first and second biasing circuits and a biasing level of the first and second branches are different, and the impedance of the third and fourth biasing circuits and a biasing level of the third and fourth branches is different and are chosen so as to maximize the cancellation of the at least one distortion component at the output of at least one of the first stage and the second stage of the discrete amplifier.

In yet other embodiments, the first, the second, the third and the fourth branches are formed on a single integrated circuit chip and the first biasing circuit, the second biasing circuit, the third biasing circuit and the fourth biasing circuit are physically located on the same single integrated circuit chip to minimize electrical parasitics so as to maximize the cancellation of the at least one distortion component. Other embodiments further comprise a sensing circuit that senses the input power to the discrete amplifier and causes at least one of the first, the second, the third and the fourth biasing circuits to adjust the operating mode of its respective branch by adjusting at least one of the bias circuit current and impedance so as to maximize the cancellation of the at least one distortion component.

In some embodiments the first mode, the second mode, the third mode and the fourth mode are chosen from one of Class A, Class B, Class C, and Class AB modes of operation, and the first, the second, the third and the fourth biasing circuits are adjusted to change the impedance of the respective biasing circuits to maximize the cancellation of the at least one distortion component.

In another embodiment, a circuit for canceling at least one distortion component at the output of the circuit comprises a power splitter having a first input port, a first output port, and a second output port, wherein a first signal is input on the power splitter first input port and is split into a second signal at the power splitter first output port and a third signal at the power splitter second output port, and a power combiner having a first input port, a second input port, and a first output port. A first amplifier has an input port coupled to the power splitter first output port, and an output port coupled to the power combiner first input port. A second amplifier is in parallel with the first amplifier, the second amplifier has an input port coupled to the power splitter second output port, and an output port coupled to the power combiner second input port. At least one biasing circuit is operatively connected with one of the first and the second amplifiers for biasing the one of the first and the second amplifiers in a different class of operation than the other of the first and the second amplifiers, and at least one control logic circuit senses the first signal and causes at least one of a size of the one of the first and the second amplifiers to change based on the first signal, and a magnitude of a biasing level of the one of the first and the second amplifiers to change based on the first signal. A fourth signal is output from the power combiner first output port having at least one distortion component reduced.

In other embodiments, a second biasing circuit is operatively connected to the other of the first and the second amplifiers for biasing the other of the first and the second amplifiers into a class of operation different than the one of the first and the second amplifiers so that the at least one distortion component is reduced in the fourth signal. In some embodiments, the at least one distortion component is a third harmonic of the first signal. In yet other embodiments the modes of operation are chosen from one of Class A, Class B, Class C, and Class AB modes of operation. In other embodiments the power splitter and the power combiner are quadrature hybrids.

The accompanying drawings, which are incorporated in and constitute a part of this specification, illustrate one or more embodiments of the invention and, together with the description, serve to explain the principles of the invention.

BRIEF DESCRIPTION OF THE DRAWINGS

A full and enabling disclosure of the present invention, including the best mode thereof directed to one of ordinary skill in the art, is set forth in the specification, which makes reference to the appended figures, in which.

Figure 1:
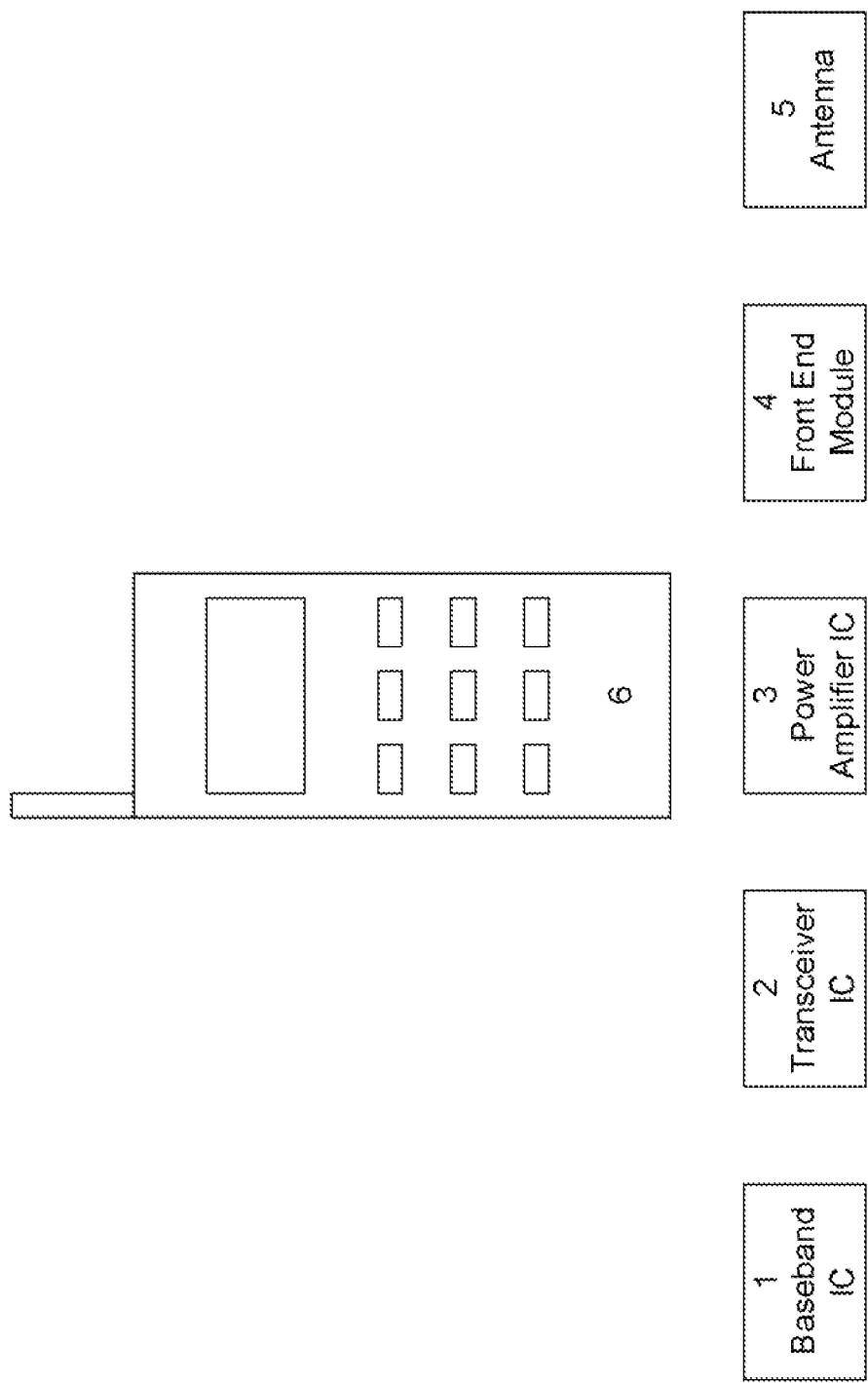
FIG. 1 illustrates a schematic of a typical RF system in a prior art cell phone.
Figure 2:
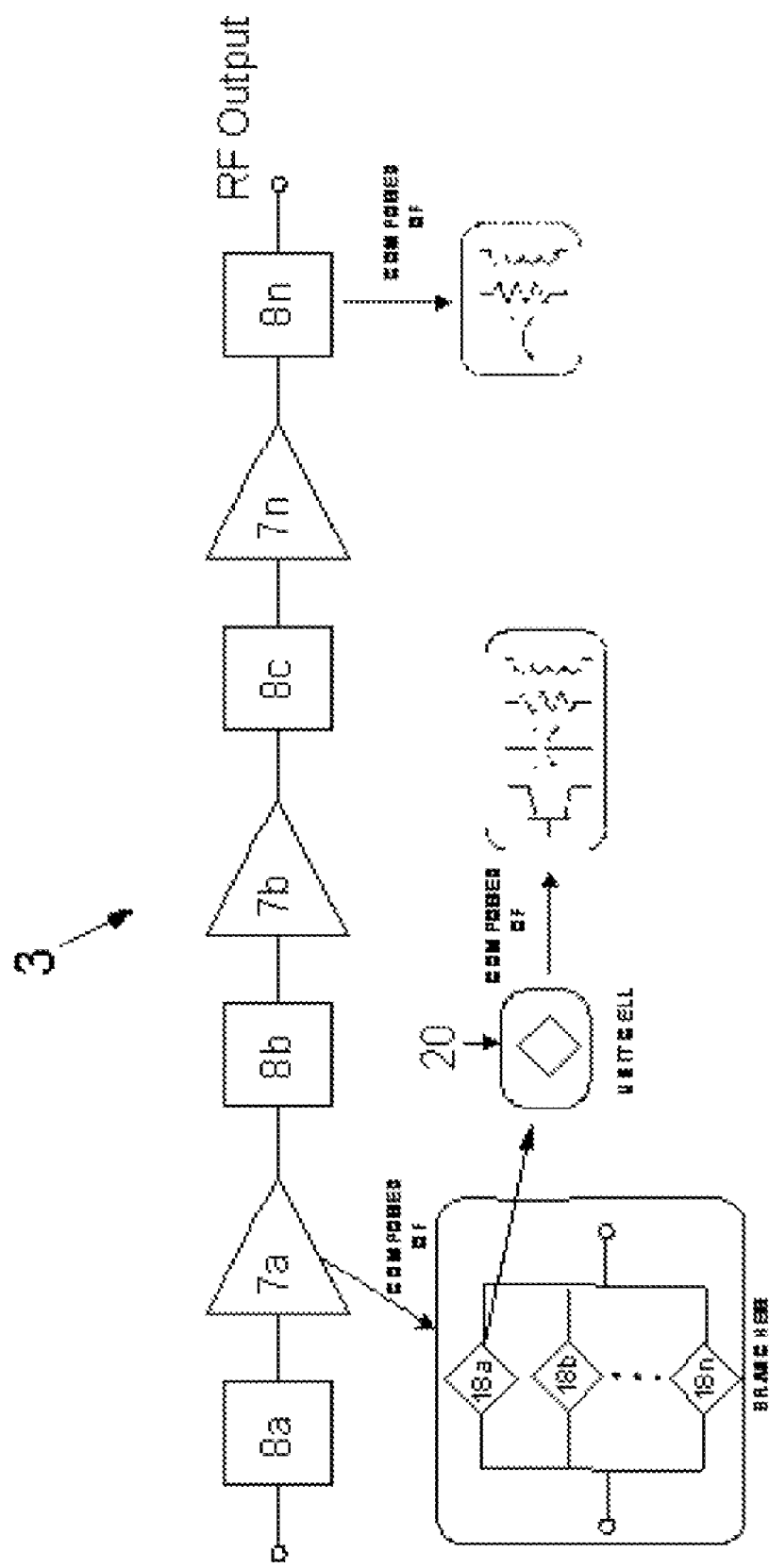
FIG. 2 illustrates a schematic of a prior art multi-stage RF/microwave power amplifier for use in the system of FIG. 1.

Repeat use of reference characters in the present specification and drawings is intended to represent same or analogous features or elements of the invention.

DETAILED DESCRIPTION OF THE INVENTION

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope and spirit thereof. For instance, features illustrated or described as part of one embodiment may be used on another embodiment to yield a still further embodiment. Thus, it is intended that the present invention covers such modifications and variations as come within the scope of the appended claims and their equivalents.

Figure 3:
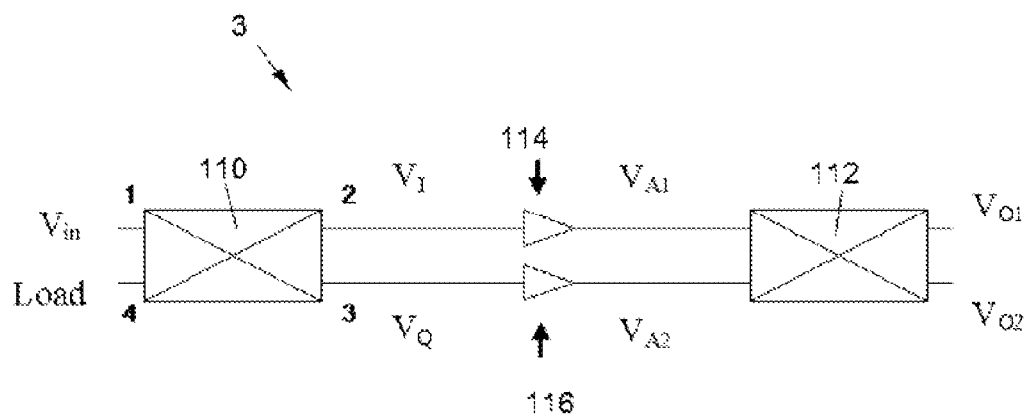
FIG. 3 illustrates a schematic of power combined amplifiers in accordance with an embodiment of the present invention.

The present invention seeks to reduce or significantly cancel the IM3 levels in power amplifiers at one or both of the component level and the sub-component level of the amplifier. In a first embodiment shown in FIG. 3, a component level quadrature balanced amplifier topology generally consists of a pre-amplifier quadrature hybrid 110, an amplifier stage consisting of two amplifiers 114 and 116 in parallel and biased in different classes of operation, and a post-amplifier quadrature hybrid 112. The input, $V_{in}$, consists of a sum of sinusoids at two different frequencies expressed as:

$$Vin = A\sin(w_1 t) + B\sin(w_2 t)$$

The input signal $V_{in}$ is passed to quadrature hybrid 110 positioned before the amplifier stage. One example of a suitable quadrature hybrid is the SHY550 90 degree hybrid coupler manufactured by Mid-Atlantic RF Systems, Inc. The input is divided into two signals with the same frequency components, but with a fraction of the power of the input and where one, $V_I$, is shifted by ▢ radians and the other signal, $V_Q$, is shifted by $-\pi/2$ radians resulting in a relative phase difference of 90 degrees:

$$V_I = \frac{A}{\sqrt{2}} * \sin(w_1 t - \pi) + \frac{B}{\sqrt{2}} * \sin(w_2 t - \pi)$$

$$V_Q = \frac{A}{\sqrt{2}} * \sin\left(w_1 t - \frac{\pi}{2}\right) + \frac{B}{\sqrt{2}} * \sin\left(w_2 t - \frac{\pi}{2}\right)$$

These signals are then passed to amplifiers 114 and 116, respectively. One example of suitable amplifiers are Model EIC5359-8 10-Volt internally matched power FET manufactured by Excelics Semiconductor, Inc. The signal amplification performed by each amplifier can be modeled respectively using the following approximate equations:

$$V_{A1} = K_1 * V_I + K_2 * V_I^2 + K_3 * V_I^3$$

$$V_{A2} = K_1' * V_Q + K_2' * V_Q^2 + K_3' * V_Q^3$$

where $K_i$ represents the coefficients of the third-order voltage transfer function of amplifier 114, and $K_i'$ represents the coefficients of the third-order voltage transfer function of amplifier 116. One important feature of this amplifier design is that the $K_3$ term in amplifier 114 and the $K_3'$ term in amplifier 116 are equal and opposite. In addition to this condition, the phase of the fundamental frequency components are substantially equal resulting in maximum power combining of the fundamental components.

The following equations examine one set of IMD3 terms. The other IMD3 terms are similar in form and follow the same mathematical operations.

One $IM3$ term from 114:

$$K_3\left[\frac{-3A^2 B}{2\sqrt{2}}[\sin^2(w_1 t) * \sin(w_2 t)]\right]$$

Using the identity $$\sin^2 \alpha = \frac{1}{2}(1 - \cos(2\alpha)) \Rightarrow K_3\left[\frac{-3A^2 B}{4\sqrt{2}}[\sin(w_2 t) - \cos(2w_1 t) * \sin(w_2 t)]\right]$$

Using the identity $\cos(\alpha) * \sin(\beta) = \frac{1}{2}\sin(\alpha + \beta) - \frac{1}{2}\sin(\alpha - \beta) \Rightarrow$ $$K_3\left[\frac{-3A^2 B}{4\sqrt{2}}\left[\sin(w_2 t) - \frac{1}{2}\sin(2w_1 t + w_2 t) + \frac{1}{2}\sin(2w_1 t - w_2 t)\right]\right]$$

One $IM3$ term from 116:

$$K_3'\left[\frac{-3A^2 B}{2\sqrt{2}}[\cos^2(w_1 t) * \cos(w_2 t)]\right]$$

Using the identity $\cos^2 \alpha =$ $$\frac{1}{2}(1 + \cos(2\alpha)) \Rightarrow K_3'\left[\frac{-3A^2 B}{4\sqrt{2}}[\cos(w_2 t) + \cos(2w_1 t) * \cos(w_2 t)]\right]$$

Using the identity $\cos(\alpha) * \cos(\beta) = \frac{1}{2}\cos(\alpha - \beta) + \frac{1}{2}\cos(\alpha + \beta) \Rightarrow$ $$K_3'\left[\frac{-3A^2 B}{4\sqrt{2}}\left[\cos(w_2 t) + \frac{1}{2}\cos(2w_1 t - w_2 t) + \frac{1}{2}\cos(2w_1 t + w_2 t)\right]\right]$$

The outputs of the amplifiers are then passed to second hybrid 112, which is the same type as the first hybrid and is used to combine the RF signals present at the output of the two amplifiers into one RF output signal. One suitable example of a hybrid is the Model SHY550 90 degree hybrid coupler from Midatlantic RF Systems, Inc. Hybrid 112 has two inputs (ports 1 and 4) and two outputs (ports 2 and 3). The "top" output port, port 2, consists of the addition of a signal from port 1 with a fraction of the power and shifted by ▢ radians and a signal from port 4 with a fraction of the power and shifted by ▢/2 radians. The "bottom" output port, port 3, consists of the addition of a signal from port 4 with half the power and shifted by ▢ radians and a signal from port 1 with half the power and shifted by ▢/2 radians. The bottom output port is taken to be the output of the device and, under ideal conditions, the IMD3 products will be substantially removed from the frequency spectrum and the fundamentals still remain. The following equations show what happens to the IMD3 terms present at the "bottom" output port, VO2.

$$V_{O2} = -j\frac{V_{A1}}{\sqrt{2}} - \frac{V_{A2}}{\sqrt{2}}$$

For the one set of IMD3 terms that was derived above, we obtain the following:

$$V_{O2} = K_3\left[\frac{-3A^2 B}{8}\left[\begin{array}{c}\sin\left(w_2 t - \frac{\pi}{2}\right) - \frac{1}{2}\sin\left(2w_1 t + w_2 t - \frac{\pi}{2}\right) + \\ \frac{1}{2}\sin\left(2w_1 t - w_2 t - \frac{\pi}{2}\right)\end{array}\right]\right] +$$

$$K_3'\left[\frac{3A^2 B}{8}\left[\cos(w_2 t) + \frac{1}{2}\cos(2w_1 t - w_2 t) + \frac{1}{2}\cos(2w_1 t + w_2 t)\right]\right]$$

Using the identity, $$\sin\left(\alpha - \frac{\pi}{2}\right) = -\cos \alpha$$

$$V_{O2} = -K_3 \frac{3A^2 B}{8}\left[-\cos(w_2 t) + \frac{\cos(2w_1 t + w_2 t)}{2} - \frac{\cos(2w_1 t - w_2 t)}{2}\right] +$$

$$K_3' \frac{3A^2 B}{8}\left[\cos(w_2 t) + \frac{\cos(2w_1 t - w_2 t)}{2} + \frac{\cos(2w_1 t + w_2 t)}{2}\right]$$

As can be seen above, when $K_3=-K_3'$ this set of IMD3 terms will cancel.

$$V_{O2} = -K_3 \frac{3A^2B}{8}[\cos(2w_1t + w_2t)]$$

Similarly all of the other IMD3 terms will cancel as well which leads to an improvement in OIP3. In particular, the reduction in IMD3 levels will move the intersection point between the extrapolated 1:1 slope of the fundamental output power and the extrapolated 3:1 slope of the third-order intermodulation products to a higher power resulting in a higher OIP3 value. Looking at the first order terms present in the amplifiers, 1st order term from amplifier 114:

$$K_1\left[\frac{-A}{\sqrt{2}}\sin(w_1t) - \frac{B}{\sqrt{2}}\sin(w_2t)\right]$$

1st order term from amplifier 116:

$$K_1'\left[\frac{-A}{\sqrt{2}}\cos(w_1t) - \frac{B}{\sqrt{2}}\cos(w_2t)\right]$$

it can be seen that the output of quadrature hybrid 112 due to these terms is as follows:

$$V_{O2} = K_1\left[\frac{j}{2}\right][A\sin(w_1t) + B\sin(w_2t)] + \left[\frac{K_1'}{2}\right][A\cos(w_1t) + B\cos(w_2t)]$$

This term reduces to:

$$V_{O2} = \left[\frac{K_1 + K_1'}{2}\right][A\cos(w_1t) + B\cos(w_2t)]$$

If the magnitude and sign of $K_1$ are substantially equal to those of $K_1'$, then the fundamental term will be present at the output of quadrature hybrid 112. Having the magnitude and sign of $K_1$ substantially equal to those of $K_1'$ also ensures that the phases of the fundamental components for both amplifiers are equal.

Figure 4:
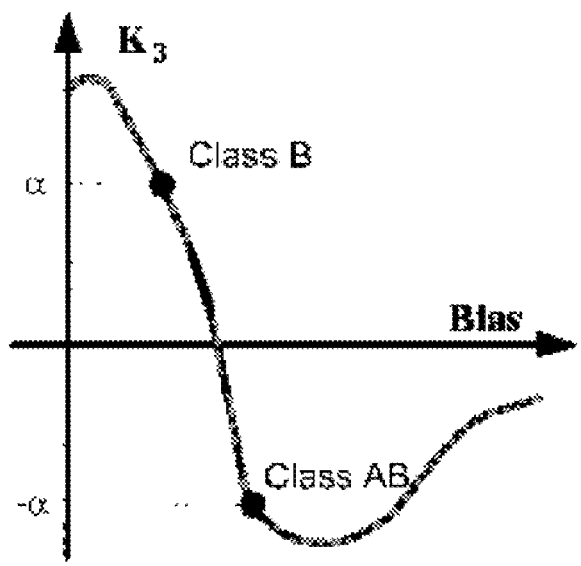
FIG. 4 illustrates the large-signal K3 curve versus bias level for the amplifiers in FIG. 3.

FIG. 4 shows the dependence of $K_3$ on the bias level of the amplifier. For example, in the class AB mode of operation an amplifier has a $K_3$ equal to $-\alpha$. In order for the second amplifier in the parallel configuration to achieve a $K_3'$ equal to $\alpha$, the bias level for this amplifier must be changed. As the bias level is dropped, the $K_3'$ term crosses the zero axis and becomes positive and reaches $\alpha$ as the amplifier approaches the class B mode of operation. By choosing bias points from this graph where $K_3$ is substantially equal to $-K_3'$, the IMD3 components present at the output will be greatly reduced if not cancelled completely.

In yet another embodiment, the phase of $K_3$ can be changed by operating the amplifier in either the gain compression mode or the gain expansion mode. In the gain compression mode, the gain of the amplifier decreases with increasing input power whereas in the gain expansion mode, the amplifier gain increases with increasing input power. The output power at the fundamental frequency can be modeled using the following terms: $K_1*A + K_3*A^3 + K_5*A^5$ where A is the amplitude of the input voltage signal and the K terms represent the Taylor series expansion coefficients that describe the amplifier's output voltage to input voltage transfer characteristics. The even order K terms do not contribute to the IMD3 components and hence have not been included in the equations. For gain expansion, the $K_3$ and $K_5$ terms are positive provided $K_1$ is positive and for gain compression, the $K_3$ and $K_5$ terms are negative. The third order IMD3 components for a two tone excitation also contain the $K_3$ and $K_5$ terms. This implies that the IMD3 components are in phase during gain expansion and 180 degrees out of phase with respect to the fundamental for gain compression. In RF amplifiers, this can be achieved by adjusting the biasing of the amplifier by varying the bias levels and/or using a biasing circuit block with specific input impedance values.

To ensure that the magnitudes of the $K_3$ terms are substantially equal in amplifiers 114 and 116, the correct size must be chosen for each amplifier. The size of the amplifier is directly related to how much power the amplifier can produce. The amplifier itself is made of many single transistors connected in parallel. Each individual transistor has a standard size depending on the fabrication process. Each transistor also contributes a portion of the total output power when the transistors are connected in parallel. As the number of transistors connected in parallel increases, so does the total output power provided by the amplifier. Therefore, size, in this case, refers to the number of transistors multiplied by the amount of active area for each transistor.

When designing an amplifier for use in the present invention it is important to know how much output power is needed so that the appropriate number of parallel transistors can be used. This total number of transistors then sets the size of the amplifier. However, two amplifiers of the same size biased at different points will generate different IMD3 levels. For example, an amplifier of a certain size biased in the class AB mode of operation will generate significantly less IMD3 terms than an amplifier of the same size biased in the near-class B mode of operation at the same input power level. Thus the near-class B mode amplifier must be sized so that its IMD3 magnitudes are substantially equal to the IMD3 magnitudes of the class AB mode amplifier at the same input power levels. One method for determining the size is by testing a number of near-class B mode amplifiers of differing sizes for the appropriate input power levels to determine the appropriate IMD3 magnitudes. That is, as the IMD3 magnitudes of the two parallel amplifiers diverge, the improvement in OIP3 seen at the output of the output quadrature hybrid 112 will not be as great had the IMD3 levels been substantially equal in magnitude and opposite in phase. Moreover, the IMD3 magnitudes of amplifiers 114 and 116 may be substantially equal at one power level, but unequal at another.

Figure 7:
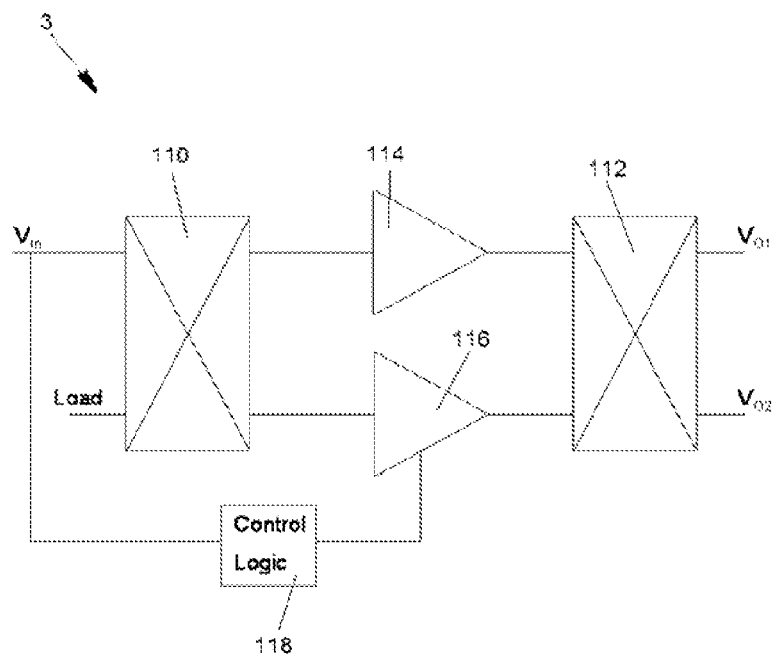
FIG. 7 illustrates a schematic for a balanced amplifier with control loop in accordance with an embodiment of the present invention.

As shown in FIG. 7, one method of overcoming this problem is by using a correction signal that is generated by monitoring the RF input signal at hybrid 110 to control the size and biasing level of amplifier 116. That is, the RF input signal $V_{in}$ is sampled and fed into a control logic block 118 that generates a digital word or correction signal by comparing input power level $V_{in}$ with levels stored in a look-up table, which are associated with the appropriate size and bias level for near-class B amplifier 116. The correction signal controls the size of near-class B amplifier 116 by controlling the number of parallel transistors that are active in the near-class B amplifier by turning on and off certain portions of the near-class B amplifier.

More specifically, if control logic 118 determines that certain portions of the near-class B amplifier should be turned off, then some of the transistors in the near-class B amplifier are shut off by reducing their bias level to zero. If, on the other hand, control logic 118 determines that certain portions of the near-class B amplifier should be turned on, then some transistors that had their bias level at zero will be raised to the near-class B level. Bias control logic 118 is located in the bias circuitry for near-class B amplifier 116. As the near-class B amplifier decreases in size, so does its IMD3 components. Likewise, as the near-class B amplifier increases in size, its resultant IMD3 components increase as well. As a result of the size adjustment capability, it possible to see OIP3 improvement across a wide range of input power levels.

Figure 8:
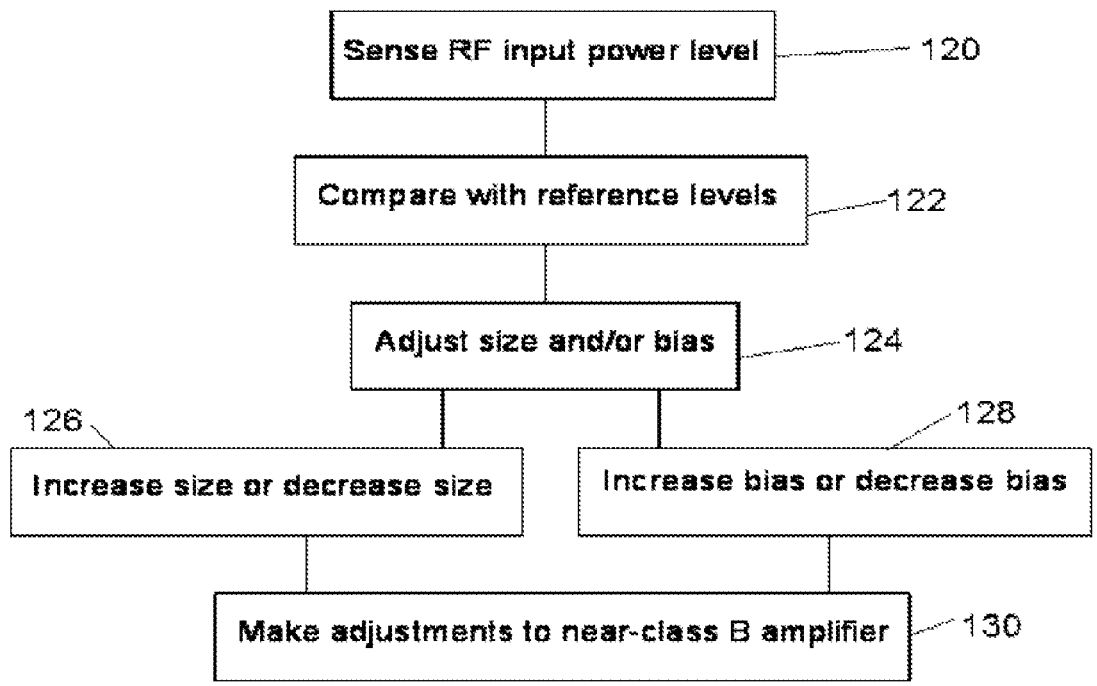
FIG. 8 shows the flowchart for control logic of FIG. 7.

FIG. 8 illustrates the steps for the control logic to handle changes made to the near-class B amplifier. The input power level is first sensed at step 120, and the information is used to decide what changes should be made to the near-class B amplifier at step 124. At step 126 and 128, a decision will be made whether to increase or decrease the size of the amplifier and to increase or decrease the bias of the amplifier, respectively, to enhance IMD3 cancellation. Once a decision is made at steps 126 and 128, the appropriate changes are made at step 130 to the near-class B amplifier to make the magnitudes of the IMD3 components of the two amplifiers substantially equal, the phases of the IMD3 components 180 degrees out of phase with respect to one another, and the phases of the fundamentals equal.

Figure 5:
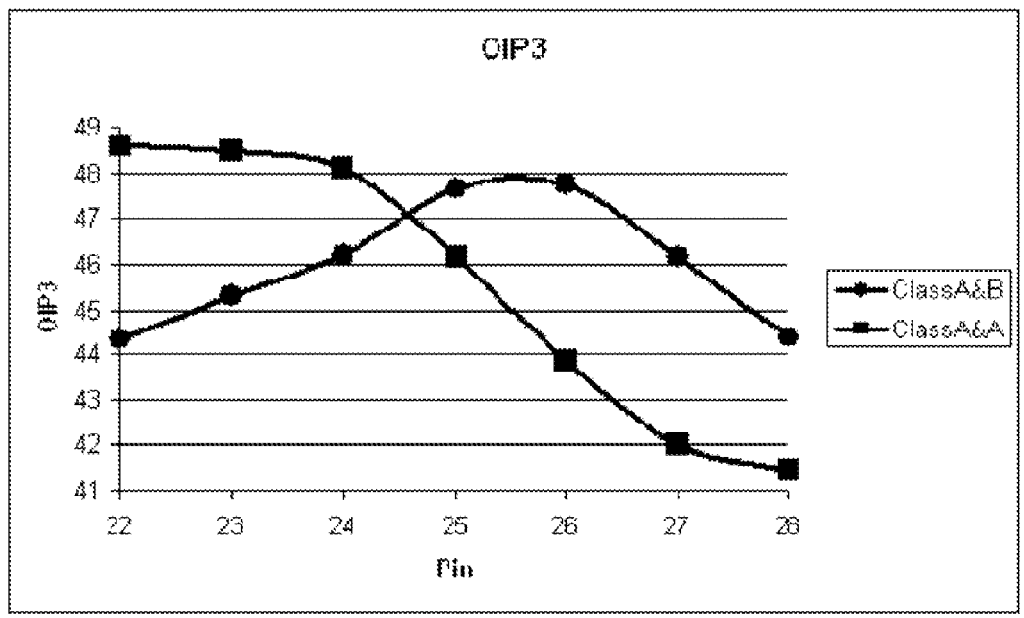
FIG. 5 illustrates the dependence of OIP3 on the bias point of the amplifiers of FIG. 3.
Figure 6:
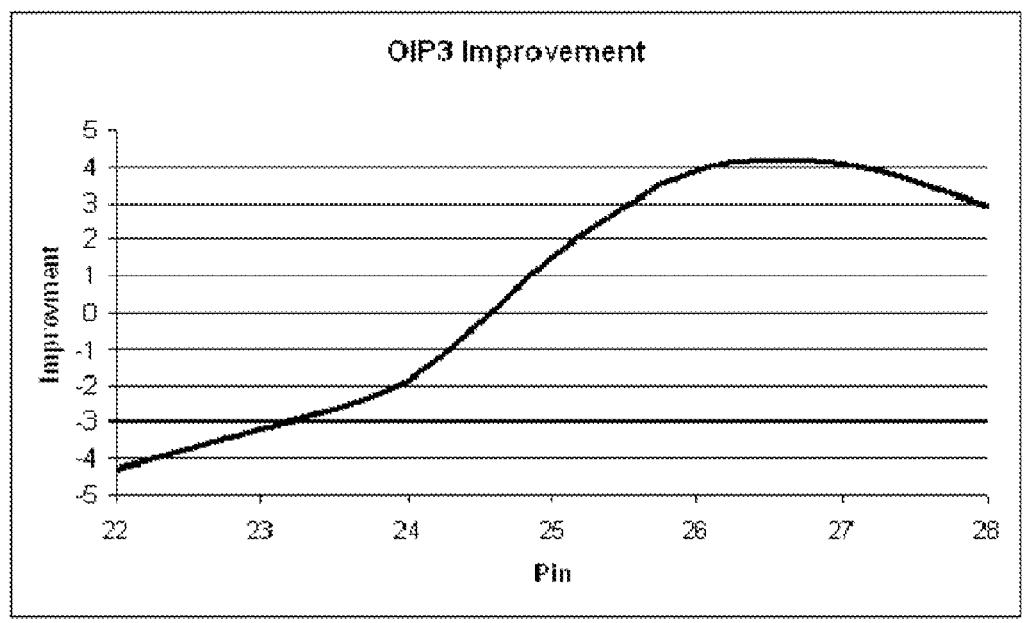
FIG. 6 illustrates the improvement in OIP3 seen when the bias point of the two amplifiers of FIG. 3 is chosen such that K3 is equal to −K3'.

One example of the effect of biasing in the proposed topology will next be described by the experimental results obtained using commercial off the shelf components at 5.7 GHz. FIG. 5 shows the dependence of OIP3 on biasing. FIG. 6 shows the improvement in OIP3 seen when the bias point is chosen such that K3 is substantially equal to −K3'. Two experiments were run both using the proposed topology and amplifiers of the same size, the EIC5359-8 10-Volt internally matched power FET from Excelics Semiconductor, Inc. The SHY550 90 degree hybrid coupler from Midatlantic RF Systems, Inc. was chosen for both the input hybrid and the output hybrid. In one case both amplifiers were biased at the same level in the class AB mode of operation and are denoted by Class A&A in FIG. 5. At this bias point, the magnitudes of the IMD3 components are substantially equal, but the IMD3 components are in-phase with one another so no cancellation or reduction of IMD3 components occurs.

In the second case, one amplifier was biased in the class AB mode of operation as above while the other was biased in the near-class B mode of operation. With each amplifier in a different mode of operation, the IMD3 components are 180 degrees out of phase with respect to one another, but their magnitudes are substantially equal over a short input power range. This experiment is denoted by Class A&B in FIG. 5. Thus, with the two amplifiers biased at different classes there is an improvement in OIP3 over a small range of input power levels. In relation to the mathematical derivations, this experimental observation is a result of the dependence of the K3 terms with input power.

FIG. 6 further illustrates the improvement shown in FIG. 5 by illustrating that for a small range of input power levels there is improvement in OIP3 of up to 4 dB. The OIP3 improvement would be over a wider power range had the experiment incorporated control loop 118 shown in FIG. 7. Therefore, while an improvement can be obtained by choosing amplifiers of similar size, variable sizing and biasing of the near-class B amplifier will result in OIP3 improvement over a broad power range. Thus, by adjusting the size and/or bias level of the near-class B amplifier, its IMD3 magnitudes could be adjusted to better match the IMD3 magnitudes of the class AB amplifier over a wide range of input powers resulting in an improvement in OIP3 over a wider input power range.

In yet another embodiment of the present invention, IM3 levels can be significantly reduced or canceled at the subcomponent level. More particularly, the IM3 levels at each stage $7_a, 7_b \ldots 7_n$ of power amplifier 3 may be significantly reduced or canceled by biasing two sets of branches in a power amplifier stage in different conduction angles of operation as described by class of operation (i.e. Class A, Class B, Class AB) with two separates bias circuits. Each biasing circuit would have distinct output impedances, with the impedance at baseband frequencies being of particular interest. Baseband frequencies are defined as the range of modulation frequencies for the input signal of interest, which typically ranges from the kHz to tens of MHz. Biasing parallel branches allows the phase difference between the IM3 components of each set of branches to approach 180 degrees. Additionally, the difference in the output impedance at baseband frequencies for the bias circuits allows for additional phase shift for the IM3 components, enabling a 180 degree difference between the IM3 components to be achieved. The number of branches in each set is adjusted such that the magnitudes of the IM3 components are substantially equal. That is, because the amplification of the sets of branches must be substantially equal to maximize performance, the number of branches in each set is adjusted to compensate for amplification differences.

The conduction angle of operation (i.e. Class A, Class AB, Class B, near-Class B) of the power amplifier branches is adjusted by varying the dc operating current in the branches with the bias circuit. Typically, control voltages and/or control currents are varied in the bias circuit to change the dc operating current and hence the conduction angle of operation. The impedance of the bias circuit can be modified, in one implementation, by using a resistor in series with the bias circuit. The value of the resistor can be varied to obtain different impedance values.

Figure 9:
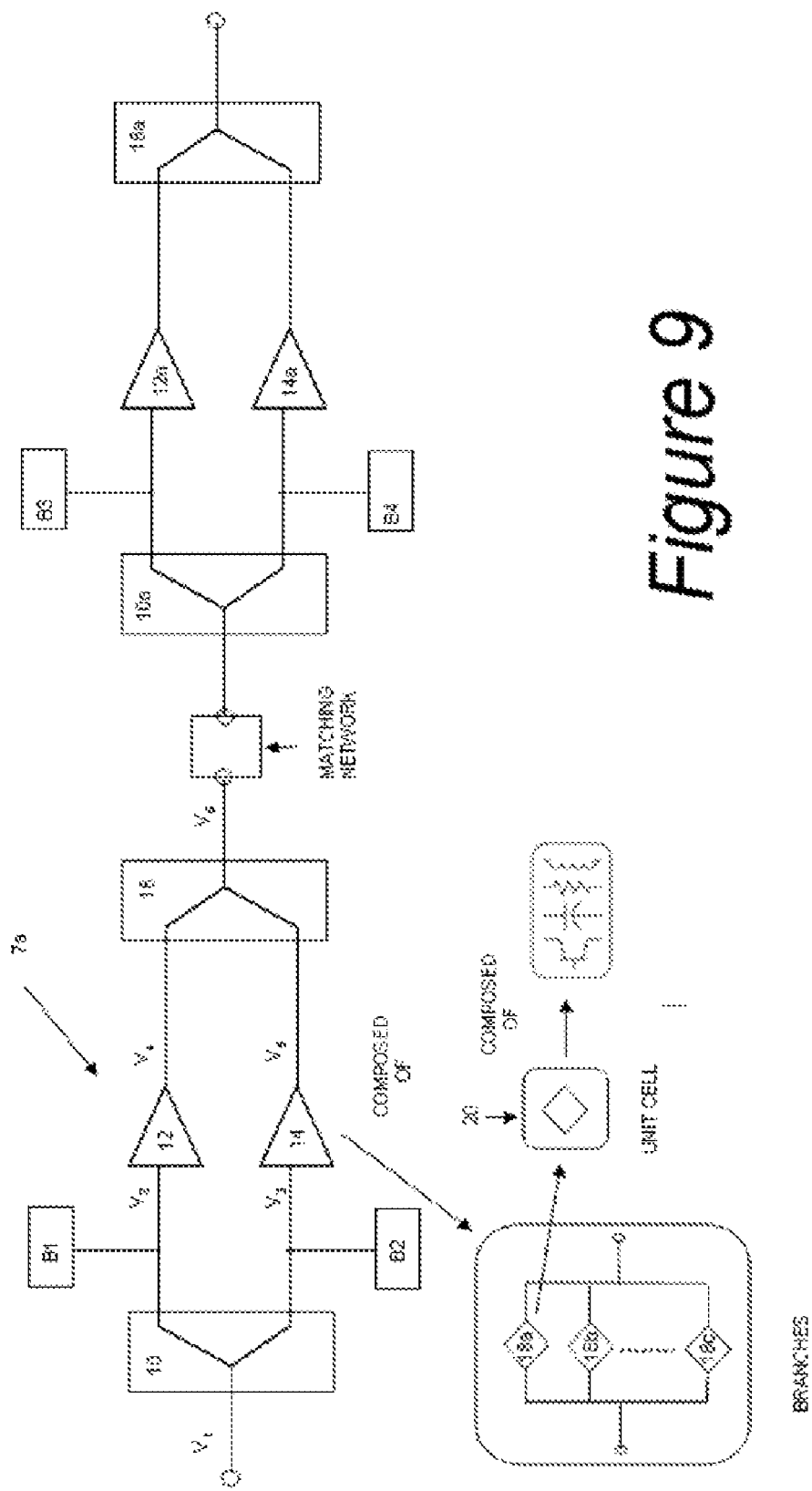
FIG. 9 illustrates a schematic of power combined branches in one stage of a power amplifier in accordance with an embodiment of the present invention.

Referring to FIG. 9, two stages of a power amplifier 7a are shown. The first stage consists of the following three components: an on-chip power divider 10, two sets of branches 12 and 14 belonging to the first stage of the amplifier with separate bias circuits B1 and B2 biasing each set of branches, followed by an on-chip power combiner 16. Each set of branches 12 and 14 comprises one or more branches 18a, 18b . . . 18n of cells 11. Cells 11 can consist of one or more transistors and other passive circuit elements. A second stage of power amplifier 7a is connected in series with the first stage by a matching network and consists of the following three components: an on-chip power divider 10a, two sets of branches 12a and 14a belonging to the second stage of the amplifier with separate bias circuits B3 and B4 biasing each set of branches, followed by an on-chip power combiner 16a. Each set of branches 12a and 14a comprises one or more branches 18a, 18b . . . 18n of cells 11. Cells 11 can consist of one or more transistors and other passive circuit elements. The input, V1, consists of a sum of sinusoids at two different frequencies:

$$V_1 = A\sin(w_1 t) + B\sin(w_2 t)$$

The input signal $V_1$ is passed to on-chip power divider 10. One example of a suitable on-chip power divider is a microstrip line with a characteristic impedance of $Z_o$ split into two quarter wave length lines with a characteristic impedance of $Z_o*\mathrm{sqrt}(2)$. The input is divided into two signals with the same frequency components, but with a fraction of the power of the input and where one, $V_2$, and the other signal, $V_3$, have no phase difference.

$$V_2 = \frac{A}{\sqrt{2}}\sin(w_1 t) + \frac{B}{\sqrt{2}}\sin(w_2 t)$$

$$V_3 = \frac{A}{\sqrt{2}}\sin(w_1 t) + \frac{B}{\sqrt{2}}\sin(w_2 t)$$

These signals are then passed to branch sets 12 and 14, respectively. The signal received by each amplifier is amplified according to the amplifier's transfer function which may be approximately modeled using the following respective equations:

$$V_4 = K_{1A} \times V_6 + K_{2A} \times V_6^2 + K_{3A} \times V_6^3$$

$$V_5 = K_{1B} \times V_7 + K_{2B} \times V_7^2 + K_{3B} \times V_7^3$$

where $K_{iA}$ represents the coefficients of the third-order voltage transfer function of branch set 12, and $K_{iB}$ represents the coefficients of the third-order voltage transfer function of branch set 14. One important feature of this amplifier stage design is that the $K_{3A}$ term in branch set 12 and the $K_{3B}$ term in branch set 14 are substantially equal and opposite. In addition to this condition, the phase of the fundamental frequency components are substantially equal resulting in maximum power combining of the fundamental components. The following equations examine one set of IMD3 terms. The other IMD3 terms are similar in form and follow the same mathematical operations.

One $IM3$ term from 12:

$$K_{3A}\left[\frac{-3A^2 B}{2\sqrt{2}}[\sin^2(w_1 t) \times \sin(w_2 t)]\right]$$

Using the identity $\sin^2 \alpha =$ $$\frac{1}{2}(1-\cos(2\alpha)) \Rightarrow K_{3A}\left[\frac{-3A^2 B}{4\sqrt{2}}[\sin(w_2 t) - \cos(2w_1 t) \times \sin(w_2 t)]\right]$$

Using the identity $\cos(\alpha) \times \sin(\beta) = \frac{1}{2}\sin(\alpha+\beta) - \frac{1}{2}(\alpha-\beta) \Rightarrow$ $$K_{3A}\left[\frac{-3A^2 B}{4\sqrt{2}}\left[\sin(w_2 t) - \frac{1}{2}\sin(2w_1 t + w_2 t) + \frac{1}{2}\sin(2w_1 t - w_2 t)\right]\right]$$

One $IM3$ term from 14:

$$K_{3B}\left[\frac{-3A^2 B}{2\sqrt{2}}[\cos^2(w_1 t) \times \cos(w_2 t)]\right]$$

Using the identity $\cos^2 \alpha =$ $$\frac{1}{2}(1+\cos(2\alpha)) \Rightarrow K_{3B}\left[\frac{-3A^2 B}{4\sqrt{2}}[\cos(w_2 t) + \cos(2w_1 t) \times \cos(w_2 t)]\right]$$

Using the identity $\cos(\alpha) \times \cos(\beta) = \frac{1}{2}\cos(\alpha-\beta) + \frac{1}{2}(\alpha+\beta) \Rightarrow$ $$K_{3B}\left[\frac{-3A^2 B}{4\sqrt{2}}\left[\cos(w_2 t) + \frac{1}{2}\cos(2w_1 t - w_2 t) + \frac{1}{2}\cos(2w_1 t + w_2 t)\right]\right]$$

The outputs of branch sets 12 and 14 are passed to second on-chip power combiner 16 that may or may not be the same type as first on-chip power divider 10 and used to combine the RF signals present at the output of the two branch sets into one RF output signal. As can be seen above, when $K_{3A} = -K_{3B}$ this set of IMD3 terms will cancel. Similarly all of the other IMD3 terms will cancel as well leading to an improvement in OIP3. To specify, the reduction in IMD3 levels will move the intersection point between the extrapolated 1:1 slope of the fundamental output power and the extrapolated 3:1 slope of the third-order intermodulation products to a higher power resulting in a higher OIP3 value. Looking at the first order terms present in amplifier branches 12 and 14, $1^{st}$ order term from 12:

$$K_{1A}\left[\frac{A}{\sqrt{2}}\sin(w_1 t) + \frac{B}{\sqrt{2}}\sin(w_2 t)\right]$$

-continued $1^{st}$ order term from 14:

$$K_{1B}\left[\frac{A}{\sqrt{2}}\sin(w_1 t) + \frac{B}{\sqrt{2}}\sin(w_2 t)\right]$$

It can be seen that the output of on-chip power combiner 16 due to these terms is as follows:

$$V_6 = \frac{(K_{1A} + K_{1B})}{2}[A \cdot \sin(w_1 t) + B \cdot \sin(w_2 t)]$$

If $K_{1A}$ is substantially equal to $K_{1B}$, then the fundamental term will be present at the output of on-chip power combiner 16. Having $K_{1A}$ substantially equal $K_{1B}$ also ensures that the phases of the fundamental components for both sets of branches are equal.

To ensure that the magnitudes of the IMD3 components are substantially equal in parallel sets of branches 12 and 14, the correct size must be chosen for each set of branches. The size of each set of branches is directly related to how much power it can produce. Two branches with the same number of unit cells biased at different points (i.e. different conduction angles of operation for each branch) will generate different IMD3 levels. For example, a branch with a certain number of unit cells 20 biased in the class AB mode of operation will generate significantly less IMD3 terms then a branch of the same size biased in the near-class B mode of operation at the same input power level. Thus, the near-class B mode amplifier must be sized so that its IMD3 magnitudes are substantially equal to the IMD3 magnitudes of the class AB mode amplifier at the same input power levels. One method for determining the size is by testing a number of near-class B mode branch sets to determine the appropriate IMD3 magnitudes. That is, as the IMD3 magnitudes of the two parallel set of branches diverge, then the improvement in OIP3 seen at the output of the output power combiner 16 will not be as great had the IMD3 levels been substantially equal in magnitude and opposite in phase. Moreover, the IMD3 magnitudes for branch sets 12 and 14 may be substantially equal at one power level, but unequal at another.

In addition to the size of the individual branch sets, the number of branch sets in a particular amplifier stage may also change based on the application of the amplifier. Thus, if a stage in the power amplifier has three branch sets, then on chip power dividers 10 and 16 must be designed to split input $V_1$ three ways and also to combine the output of three branch sets into a single output signal $V_6$. Thus, it should be understood that the number of branch sets in any one amplifier stage 7 may vary depending on the application of power amplifier 3.

In yet another embodiment, the phase of $K_3$ can be changed by operating the amplifier in either the gain compression mode or the gain expansion mode. In the gain compression mode, the gain of the branch or set of branches decreases with increasing input power whereas in the gain expansion mode, the branch gain increases with increasing input power. The output power at the fundamental frequency can be modeled using the following terms: $K_1*A + K_3*A^3 + K_5*A^5$ where A is the amplitude of the input voltage signal and the K terms represent the Taylor series expansion coefficients that describe the branch's output voltage to input voltage transfer characteristics. The even order K terms do not contribute to the IMD3 components and hence have not been included in the equations.

For gain expansion, the $K_3$ and $K_5$ terms are positive provided $K_1$ is positive, and for gain compression, the $K_3$ and $K_5$ terms are negative. The third order IMD components for a two tone excitation also contain the $K_3$ and $K_5$ terms. This implies that the IMD3 components are in phase with respect to the fundamental during gain expansion and anti-phase with respect to the fundamental for gain compression. In RF amplifiers, this can be achieved by adjusting the biasing of one or more branches by varying the bias levels and using biasing circuits with different impedances.

The range of power levels where improvement is observed may vary as this technique is used in different semiconductor IC processes, and the incorporation of a control loop may assure the improvement over a broad power range. A common problem is that the $K_3$ term, as related to the mathematical derivations, may vary as a function of RF input power. Thus, a control loop may be used to compensate for the changes in $K_3$ by adjusting the bias level (i.e. conduction angle) and the impedance of the bias circuit of both power amplifier branch sets. This dynamic compensation for the changes in $K_3$ as a function of RF power allows the IMD3 magnitudes and phases to be adjusted for optimal IM3 cancellation/reduction over a wide range of input powers.

Figure 10:
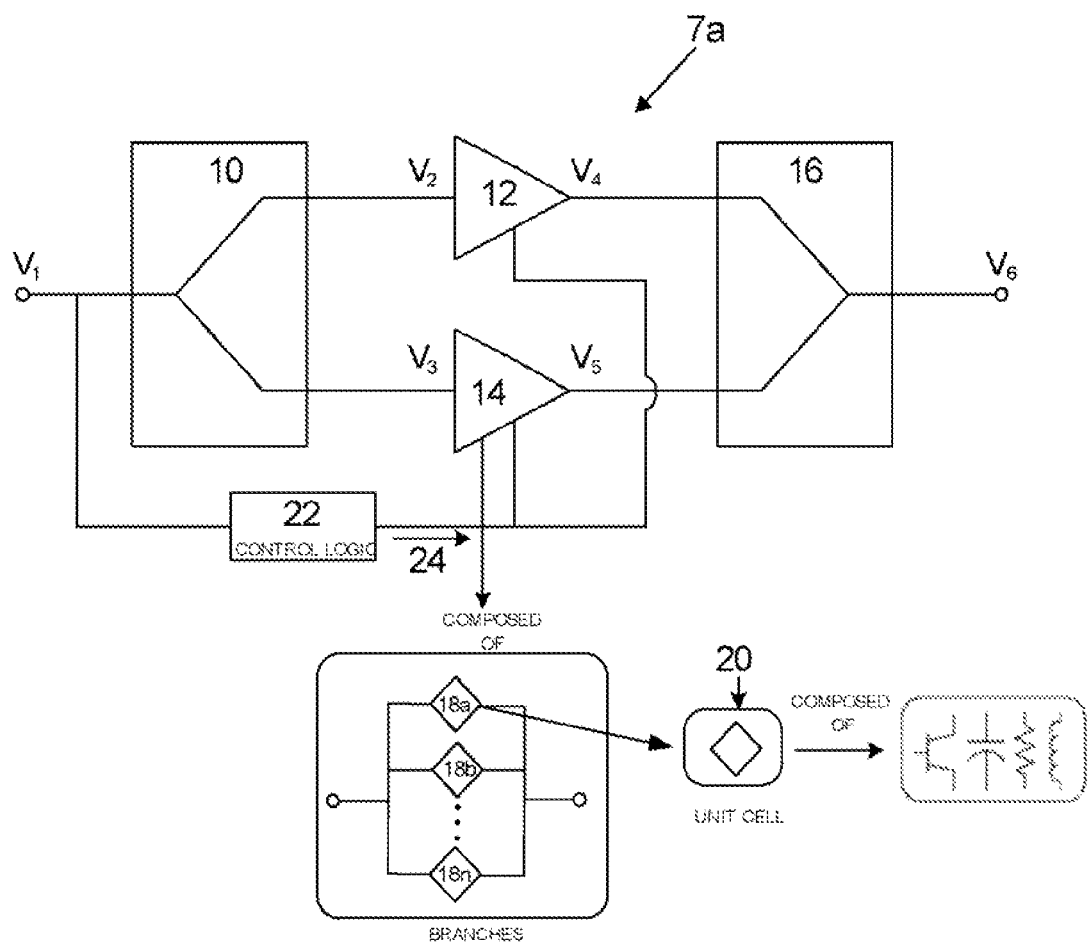
FIG. 10 illustrates a schematic of power combined branches in one stage of a power amplifier with control logic in accordance with an embodiment of the present invention.

Referring to FIG. 10, a control loop 22 is shown connected from input $V_1$ to the biasing circuit (not shown) for branch sets 12 and 14 of amplifier stage 7a. A correction signal 24 is generated by monitoring the RF input signal $V_1$ to control the biasing level and impedance of the bias circuit (not shown) of branch sets 12 and 14 as a function of power. That is, the RF input signal $V_1$ is sampled and fed into control logic block 22, which generates the appropriate bias levels for the applied RF input power. These bias levels may be generated by any number of means, such as (but not limited to) comparing the input power level $V_1$ with levels stored in a look-up table or by using a circuit block to directly generate the respective bias levels for the specific input power level. Correction signal 24 controls the bias levels and bias circuit impedance of branch sets 12 and 14 by varying the control voltages for the bias circuit (not shown). More specifically, if control logic 22 determines that branch set 14 should be biased more towards a Class AB mode, then the control voltages of the bias circuits will be adjusted accordingly. Bias control logic 22, in one implementation, can be located in the bias circuitry for branch set 14 and also in branch set 12. Also, the impedance of the bias circuit can be adjusted with switches that turn on or off segments of a parallel resistor array (not shown). As a result of the bias/impedance adjustment capability of the bias circuit (not shown), OIP3 improvement across a wide range of power levels can be obtained.

Figure 11:
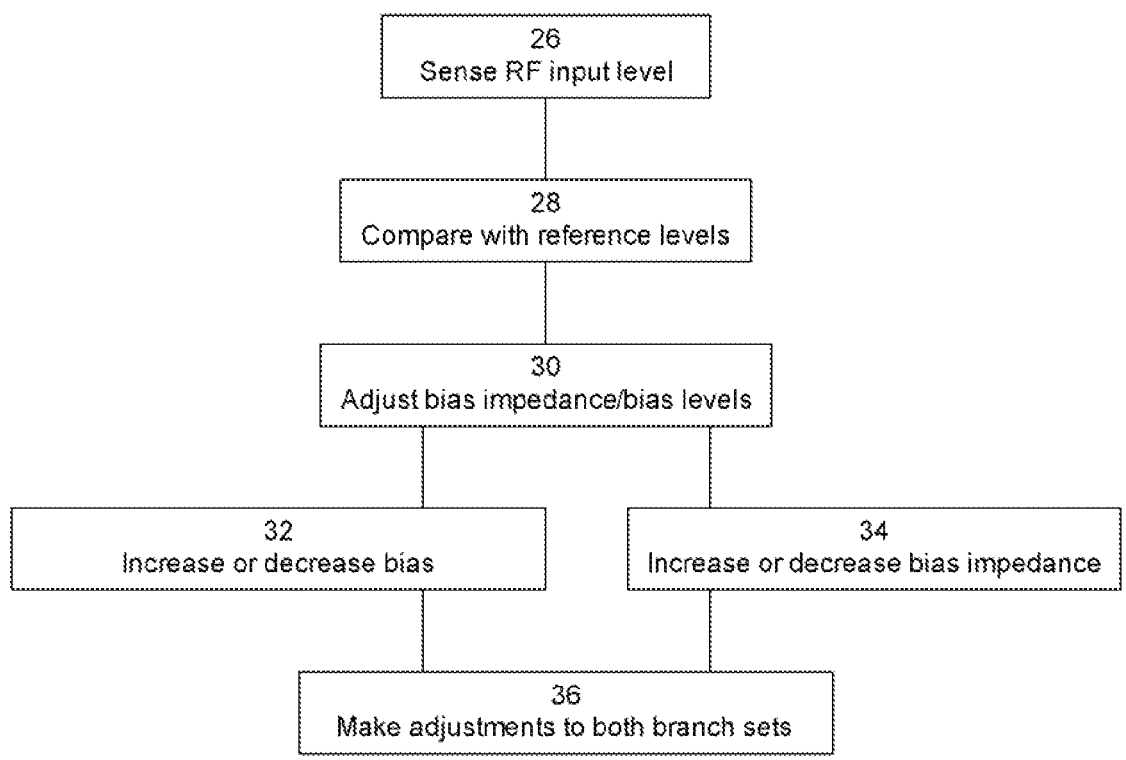
FIG. 11 illustrates a flowchart for the control logic of FIG. 10.

Referring to FIG. 11, a flowchart for control logic 22 is shown. Input power level $V_1$ is first sensed at step 26, and the information is used to determine the changes that should be made to branch sets 12 and 14 by comparing the sensed signal to, for example, (1) values stored in a look-up table, in step 28 or (2) converting the sensed signal to the respective bias/impedance levels for the bias circuits. The possible changes to the bias circuits are: (1) change the impedance of the bias circuit, step 34 or (2) increase/decrease the bias of the branches, step 32. Once a decision is made in control logic block 22, the appropriate changes are made to branch sets 12 and 14, at step 36, to make the magnitudes of the IMD3 components of branch sets 12 and 14 substantially equal, the phases of the IMD3 components 180 degrees out of phase with respect to one another, and the phases of the fundamentals nearly equal.

The above described amplifier improvements for IM3 reduction results in very wide band solutions and can be implemented completely on-chip. The techniques are based on a unique power amplifier topology combined with a novel biasing technique at the amplifier branch level. The techniques are very flexible and can be applied to any IC process (i.e. Si CMOS, SiGe BiCMOS, GaAs HBT, etc. . . . )

It should be appreciated by those skilled in the art that various modifications and variations can be made in the present invention without departing from the scope and spirit of the invention. It is intended that the present invention cover such modifications and variations as come within the scope and spirit of the appended claims and their equivalents.

We claim:

1. A discrete amplifier for canceling at least one distortion component at the output of the discrete amplifier comprising:
   a. a first stage having at least a first branch and a second branch in parallel with one another, wherein each of said first and second branches is formed of one or more transistor legs having one or more unit cells in parallel with one another;
   b. a second stage having at least a third branch and a fourth branch in parallel with one another, wherein each of said third and fourth branches is formed of one or more transistor legs having one or more unit cells in parallel with one another;
   c. a first biasing circuit having a first impedance and a first biasing level, said first biasing circuit being operatively connected to said first stage first branch for biasing said first branch into a first mode of operation;
   d. a second biasing circuit having a second impedance and a second biasing level, said second biasing circuit being operatively connected to said first stage second branch for biasing said second branch into a second mode of operation;
   e. a third biasing circuit having a third impedance and a third biasing level, said third biasing circuit being operatively connected to said second stage third branch for biasing said third branch into a third mode of operation;
   f. a fourth biasing circuit having a fourth impedance and a fourth biasing level, said fourth biasing circuit being operatively connected to said second stage fourth branch for biasing said fourth branch into a fourth mode of operation, wherein at least one of
      a. said first mode of operation and said second mode of operation, and
      b. said third mode of operation and said fourth mode of operation are chosen so that at least one distortion component is substantially canceled at a respective output of at least one of said first stage and said second stage.

2. The discrete amplifier of claim 1, wherein said first biasing circuit first impedance and first biasing level differs from said second biasing circuit second impedance and second biasing level.

3. The discrete amplifier of claim 1, wherein
   a. said impedance of said first and second biasing circuits and said biasing level of said first and second branches are different from one another, and
   b. said impedance of said third and fourth biasing circuits and said biasing level of said third and fourth branches are different from one another,
and chosen so as to maximize the cancellation of said at least one distortion component at the output of at least one of said first stage and said second stage of said discrete amplifier.

4. The discrete amplifier of claim 1, wherein said first, said second, said third and said fourth branches are formed on a single integrated circuit chip and said first biasing circuit, said second biasing circuit, said third biasing circuit and said fourth biasing circuit are physically located on said same single integrated circuit chip to minimize electrical parasitics so as to maximize the cancellation of said at least one distortion component.

5. The discrete amplifier of claim 1, further comprising a sensing circuit that senses the input power to said discrete amplifier and causes at least one of said first, said second, said third and said fourth biasing circuits to adjust the operating mode of its respective branch by adjusting at least one of said biasing circuit level and impedance so as to maximize the cancellation of said at least one distortion component.

6. The discrete amplifier of claim 1, wherein said first mode, said second mode, said third mode and said fourth mode are chosen from one of Class A, Class B, Class C, and Class AB modes of operation.

7. The discrete amplifier of claim 6, wherein said first, said second, said third and said fourth biasing circuits are adjusted to change the impedance of said respective biasing circuits to maximize the cancellation of said at least one distortion component.

8. The discrete amplifier of claim 6, wherein said first branch first mode and said second branch second mode cause a substantial cancellation of at least one harmonic.

9. The discrete amplifier of claim 6, wherein said third branch third mode and said fourth branch fourth mode cause a substantial cancellation of a third order inter-modulation distortion component.

10. The discrete amplifier of claim 6, wherein one of said first stage first branch and said first stage second branch have a plurality of transistor legs to increase the output power of said one of said first stage first branch and said first stage second branch.

11. A discrete amplifier for canceling at least one distortion component at the output of the discrete amplifier comprising:
   a. an input port for receiving a first signal;
   b. an output port for outputting a second signal that is related to said first signal;
   c. a first branch operatively connected to said input and said output ports and a second branch in parallel with said first branch and operatively connected to said input and said output ports,
   d. a first biasing circuit operatively connected to said first branch for biasing said first branch into a first mode of operation;
   e. a second biasing circuit operatively connected to said second branch for biasing said second branch into a second mode of operation;
   f. a sensing circuit that senses said first signal and causes at least one of said first and said second biasing circuits to change the operating mode of its respective branch by adjusting at least one of a biasing circuit current and impedance so as to maximize the cancellation of said at least one distortion component,
      wherein said first mode of operation and said second mode of operation are chosen so that said at least one distortion component in said second signal is substantially reduced.

12. The circuit of claim 11, wherein said first and said second branches are formed on a single integrated circuit chip and said first and said second biasing circuit are physically located on said same single integrated circuit chip to minimize electrical parasitics so as to maximize the cancellation of said at least one distortion component.

13. The discrete amplifier of claim 11, wherein said at least one distortion component is a third harmonic of said first signal.

14. The discrete amplifier of claim 11, wherein said mode of operation is chosen from one of Class A, Class B, Class C, and Class AB modes of operation.

15. A circuit for canceling at least one distortion component at the output of the circuit comprising:
   a. a power splitter having
      i. a first input port,
      ii. a first output port, and
      iii. a second output port;
      wherein a first signal is input on said power splitter first input port and is split into a second signal at said power splitter first output port and a third signal at said power splitter second output port;
   b. a power combiner having
      i. a first input port,
      ii. a second input port, and
      iii. a first output port,
   c. a first amplifier having
      i. an input port coupled to said power splitter first output port, and
      ii. an output port coupled to said power combiner first input port;
   d. a second amplifier in parallel with said first amplifier, said second amplifier having
      i. an input port coupled to said power splitter second output port, and
      ii. an output port coupled to said power combiner second input port;
   e. at least one biasing circuit operatively connected with one of said first and said second amplifiers for biasing said one of said first and said second amplifiers in a different class of operation than the other of said first and said second amplifiers; and
   f. at least one control logic circuit for sensing said first signal and for causing at least one of
      i. a size of said one of said first and said second amplifiers to change based on said first signal, and
      ii. a magnitude of a biasing level of said one of said first and said second amplifiers to change based on said first signal,
      wherein a fourth signal is output from said power combiner first output port having at least one distortion component reduced.

16. The circuit of claim 15, further comprising a second biasing circuit operatively connected to said other of said first and said second amplifiers for biasing said other of said first and said second amplifiers into a class of operation different than said one of said first and said second amplifiers so that said at least one distortion component is reduced in said fourth signal.

17. The circuit of claim 15, wherein said at least one distortion component is a third harmonic of said first signal.

18. The circuit of claim 15, wherein said at least one distortion component is a third order inter-modulation product of said first signal.

19. The circuit of claim 15, wherein said modes of operation are chosen from one of Class A, Class B, Class C, and Class AB modes of operation.

20. The circuit of claim 15, wherein said power splitter and said power combiner are quadrature hybrids.

21. A discrete amplifier for canceling at least one distortion component at the output of the discrete amplifier comprising:
   a. a first stage having at least a first branch and a second branch in parallel with one another;
   b. a second stage having at least a third branch and a fourth branch in parallel with one another;
   c. a first biasing circuit operatively coupled to said first stage first branch, said first biasing circuit being configured to provide a first impedance and a first biasing level that drives said first branch into a first mode of operation;
   d. a second biasing circuit operatively coupled to said first stage second branch, said second biasing circuit being configured to provide a second impedance and a second biasing level that drives said second branch into a second mode of operation that is different from said first mode of operation;

e. a third biasing circuit operatively coupled to said second stage third branch, said third biasing circuit being configured to provide a third impedance and a third biasing level that drives said third branch into a third mode of operation;

f. a fourth biasing circuit operatively coupled to said second stage fourth branch, said fourth biasing circuit being configured to provide a fourth impedance and a fourth biasing level that drives said fourth branch into a fourth mode of operation that is different from said third mode of operation, wherein
said first and said second bias circuit impedances at baseband frequencies are different,
said third and fourth bias circuit impedances at baseband frequencies are different, and
are chosen so that at least one distortion component is substantially cancelled at a respective output of at least one of said first stage and said second stage.

* * * * *